United States Patent [19]

Inn

[11] Patent Number: 5,889,441

[45] Date of Patent: Mar. 30, 1999

[54] TEMPERATURE AND VOLTAGE INDEPENDENT ON-CHIP OSCILLATOR SYSTEM AND METHOD

[75] Inventor: Bruce L. Inn, San Jose, Calif.

[73] Assignee: Scenix Semiconductor, Inc., Santa Clara, Calif.

[21] Appl. No.: 989,436

[22] Filed: Dec. 12, 1997

[51] Int. Cl.$^6$ .............................. H03B 5/04; H03B 5/20; H03B 5/24; H03L 1/02

[52] U.S. Cl. .......................... 331/143; 331/111; 331/173; 331/176; 331/179

[58] Field of Search .................................. 331/111, 143, 331/153, 173, 176, 179

[56] References Cited

U.S. PATENT DOCUMENTS

| | | | |
|---|---|---|---|
| 4,224,658 | 9/1980 | Siiberg | 362/183 |
| 4,603,308 | 7/1986 | Briefer | 331/143 |
| 4,853,646 | 8/1989 | Johnson et al. | 330/256 |
| 4,868,525 | 9/1989 | Dias | 331/111 |
| 5,180,991 | 1/1993 | Takashima | 331/1 A |

*Primary Examiner*—David Mis
*Attorney, Agent, or Firm*—Fenwick & West LLP

[57] ABSTRACT

A system and method for ensuring a substantially constant oscillator frequency that is substantially independent of the operating temperature and is substantially independent of variations of the supply voltage level where the oscillator is an on-chip oscillator without requiring significantly additional logic, e.g., not requiring the use of multiple comparators and enabling post packaging modifications of the oscillator frequency. The present invention utilizes one or more paired resistors as part of the RC oscillator where each of the one or more pairs are matched according to their temperature coefficient. That is, each pair includes a resistor with a positive temperature coefficient and a resistor with a corresponding negative temperature coefficient. In addition, the present invention enables post packaging modifications to the resistors based upon one or more program signals that can modify the resistance by forming a short circuit around one or more resistor pairs. The present invention also reduces the effect of voltage variations on the oscillator frequency by comparing a oscillatory signal with a reference signal that is a fixed percentage of the supply voltage. If the supply voltage signal drops, the capacitor of the RC oscillator charges at a slower rate but the oscillatory signal is compared to a reference signal having a lower value since the reference signal is a fixed percentage of the supply voltage.

8 Claims, 3 Drawing Sheets

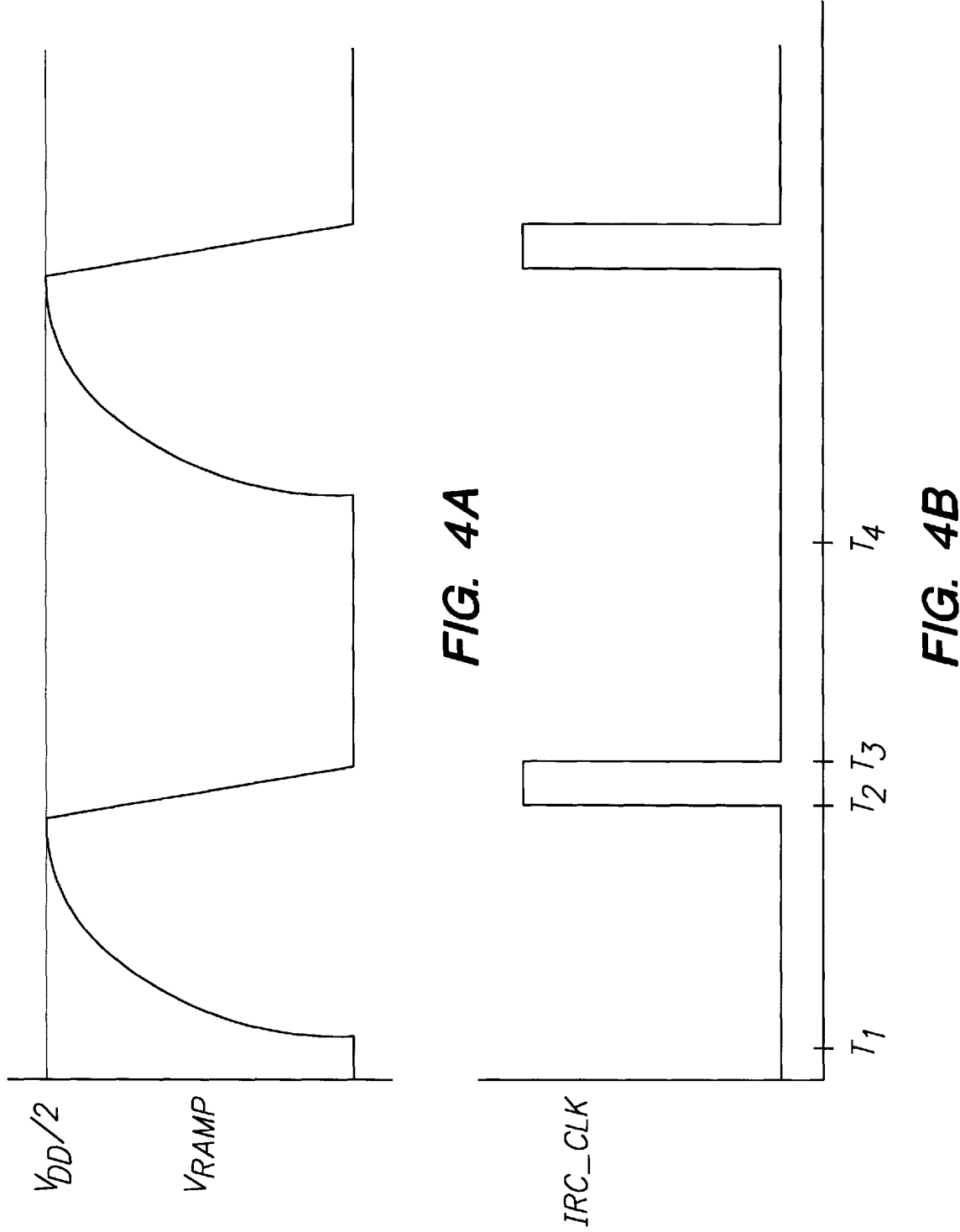

5,889,441

TEMPERATURE AND VOLTAGE INDEPENDENT ON-CHIP OSCILLATOR SYSTEM AND METHOD

BACKGROUND OF THE INVENTION

1. Field of the Invention

The present invention relates generally to the field of microcontrollers and more particularly to microcontroller on chip oscillators.

2. Description of Background Art

Advances in technology have led to an increase in performance and a decrease in size of semiconductor microcontroller or microprocessor chips. Microcontrollers are devices that can control the operation of many items, e.g., braking systems in automobiles, automatic water sprinklers, and cellular telephones. Microcontrollers generally receive power from a supply voltage that is external to the microcontroller. This supply voltage can vary during brown out conditions, for example. In addition, as indicated above microcontrollers are used in a variety of situations and in a variety of environments. Some microcontrollers are used in locations that experience a wide temperature variance. For example, in an automobile engine a microcontroller may be exposed to temperatures that exceed 140 degrees Centigrade and to temperatures that are below negative 30 degrees Centigrade. The frequency of clock pulses generated by conventional oscillator systems is affected by the operating temperature. For example, the transistor-level components of conventional oscillators are temperature dependent which result in oscillator frequency variations.

Such frequency variations are undesirable. In many situations the consistency of the oscillator frequency is important for proper operation of a device. Accordingly, an oscillator that is substantially independent of the operating temperature and of variations of the supply voltage level is necessary for proper operation of many devices.

One conventional oscillation system that attempts to solve some of the above identified problems is described in U.S. Pat. No. 5,565,819 to Cooper which is incorporated by reference herein in its entirety. In Cooper, voltage variations are addressed by requiring multiple comparators, at least one for an upper predefined voltage limit and one for a lower predefined voltage limit. Each comparator compares an oscillatory signal to a modified voltage signal that is slightly below (or above) a threshold voltage for that the oscillatory signal. The design purports to switch each comparator when the oscillatory signal reaches this modified voltage signal in order to account for a delay in the flip-flop transition. Cooper describes a system that purports to oscillate between two voltage levels where these voltage levels are purported to have negligible temperature or power supply variations effects. That is, the voltage level of the oscillator signal is purported to nearly independent of negligible temperature or power supply variations.

However, Cooper does not address the problem of oscillator frequency variations based upon temperature and supply voltage variations. For example, the values of resistors are dependent upon the temperature. When resistors are used in an RC oscillator circuit the resistor values vary as a function of temperature causing the oscillator frequency to vary.

In addition, the Cooper design uses multiple comparators and multiple voltage sampling which is costly in terms of the additional logic necessary to implement. This size problem is compounded if the oscillator is to be located on a microcontroller itself, i.e., it is an on-chip oscillator.

What is needed is a system and method for (1) ensuring a substantially constant oscillator frequency that is substantially independent of the operating temperature; (2) ensuring a substantially constant oscillator frequency that is substantially independent of variations of the supply voltage level; (3) where the oscillator is an on-chip oscillator; (4) without requiring significantly additional logic, e.g., not requiring the use of multiple comparators; and (5) enabling post packaging modifications of the oscillator frequency.

SUMMARY OF THE INVENTION

The invention is a system and method for ensuring a substantially constant oscillator frequency that is substantially independent of the operating temperature and is substantially independent of variations of the supply voltage level where the oscillator is an on-chip oscillator without requiring significantly additional logic, e.g., not requiring the use of multiple comparators and enabling post packaging modifications of the oscillator frequency.

The present invention utilizes one or more paired resistors as part of the RC oscillator where each of the one or more pairs are matched according to their temperature coefficient. That is, each pair includes a resistor with a positive temperature coefficient and a resistor with a corresponding negative temperature coefficient. In addition, the present invention enables post packaging modifications to the resistors based upon one or more program signals that can modify the resistance by forming a short circuit around one or more resistor pairs. The present invention also reduces the effect of voltage variations on the oscillator frequency by comparing a oscillatory signal with a reference signal that is a fixed percentage of the supply voltage. If the supply voltage signal drops, the capacitor of the RC oscillator charges at a slower rate but the oscillatory signal is compared to a reference signal having a lower value since the reference signal is a fixed percentage of the supply voltage.

BRIEF DESCRIPTION OF THE DRAWINGS

FIG. 4 is a timing diagram illustrating the oscillator voltage signal and the on-chip oscillator pulse signal according to an example of one embodiment of the present invention.

DETAILED DESCRIPTION OF THE PREFERRED EMBODIMENTS

A preferred embodiment of the present invention is now described with reference to the figures where like reference numbers indicate identical or functionally similar elements. Also in the figures, the left most digits of each reference number corresponds to the figure in which the reference number is first used.

Figure 1:
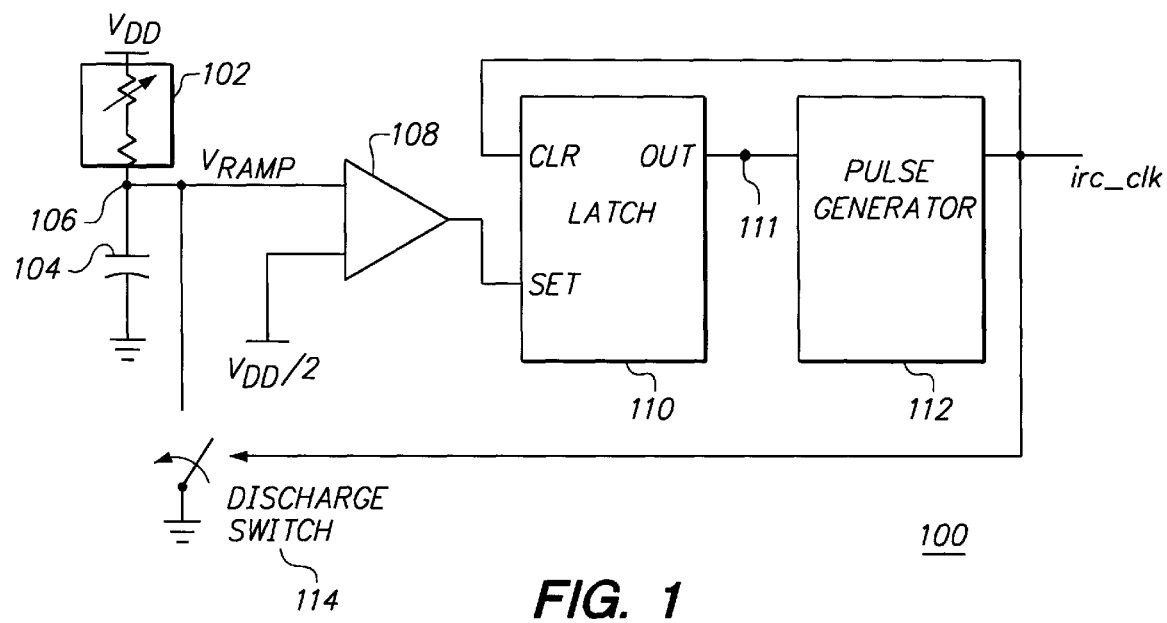
FIG. 1 is an illustration of an on-chip oscillator according to one embodiment of the present invention.

FIG. 1 is an illustration of the on-chip oscillator 100 according to one embodiment of the present invention. The on-chip oscillator 100 includes a matched resistor module 102, a charge capacitor 104, a comparator 108, a latch 110, a pulse generator 112, and a discharge switch. The matched resistor module 102 and charge capacitor 104 form an oscillatory signal as the capacitor 104 is charged. The oscillatory signal ($V_{RAMP}$) is received by the comparator 108. When the oscillatory signal reaches the value of $V_{DD}/2$ the comparator 108 generates a comparator signal that is received by the SET input of the latch 110. The latch 110 outputs a signal to the pulse generator that generates a clock pulse signal. When the clock pulse signal is generated a signal is sent to a discharge switch 114 that discharges the charge capacitor 104 and the process repeats. A more detailed description of one embodiment of the on-chip oscillator system and method of the present invention is described below with reference to FIGS. 2–4.

Figure 2:
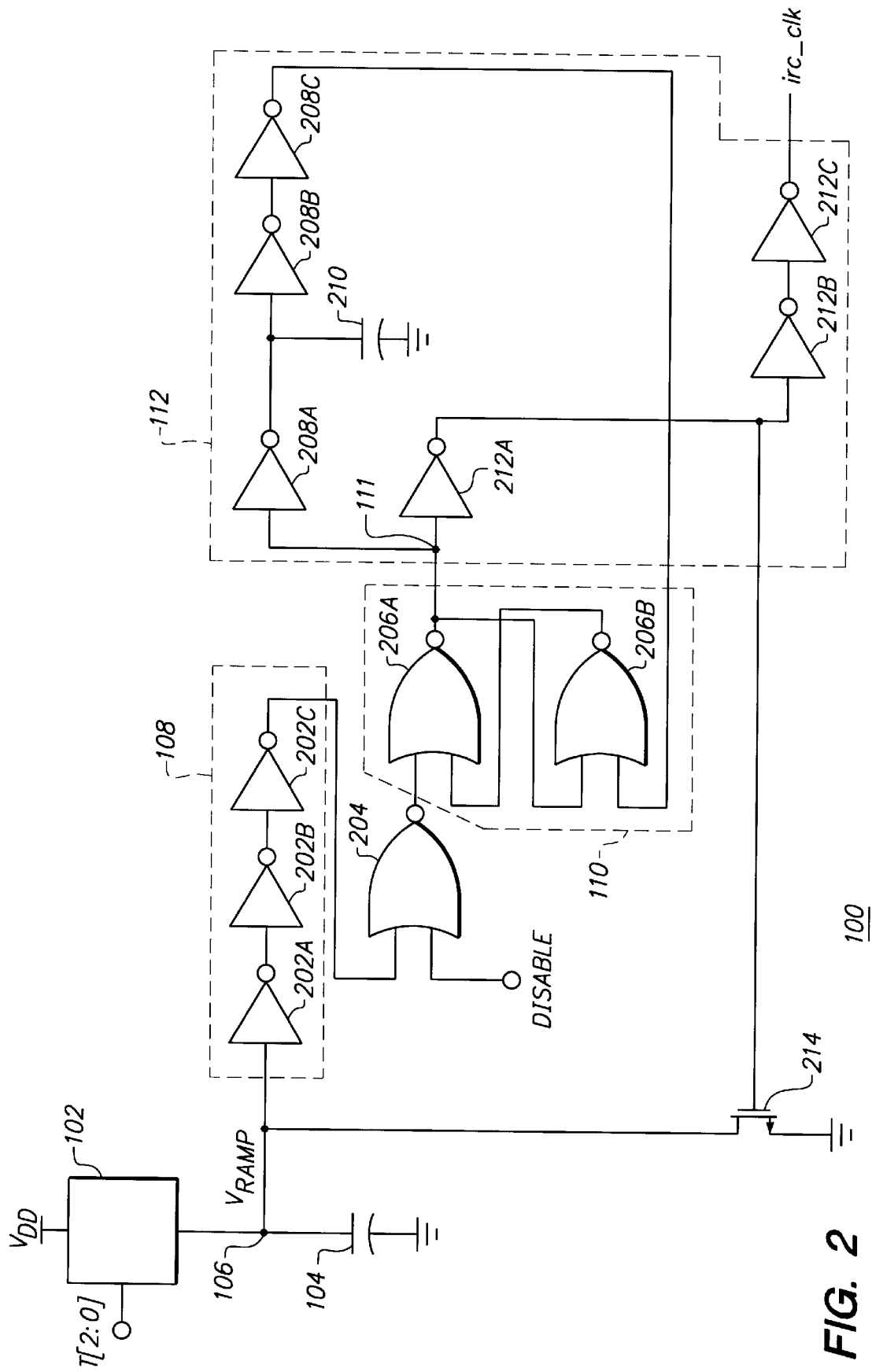
FIG. 2 is a more detailed illustration of the on-chip oscillator according to one embodiment of the present invention.

FIG. 2 is a more detailed illustration of the on-chip oscillator 100 according to one embodiment of the present invention. The on-chip oscillator 100 includes the matched resistor module 102, the charge capacitor 104, the comparator 108, the latch 110, the pulse generator 112 and the discharge switch 114. The comparator 108 includes three inverters 202A–C aligned sequentially having a voltage signal of the value $V_{DD}$ as a power supply input (not shown). In one embodiment of the present invention each inverter includes a p-type metal oxide semiconductor field effect transistor (pmos) and an n-type metal oxide semiconductor field effect transistor (nmos). In one embodiment each of the pmos's has a width of 20 microns (U) and a length of 0.5 U and each of the nmos's has a width of 10 U and a length of 0.5 U. A NOR gate 204 includes pmos's having a width of 20 U and a length of 0.5 U and nmos's having a width of 10 U and a length of 0.5 U. Each inverter includes at least one nmos and one pmos such with the output of the inverter being the node therebetween such that the comparator effectively compares the $V_{RAMP}$ with $V_{DD}/2$.

In this embodiment, the latch 110 includes two NOR gates 206A–B. Each NOR gate 206 includes pmos's having a width of 20 U and a length of 0.5 U and nmos's having a width of 10 U and a length of 0.5 U. The pulse generator 112 includes a first series of three inverters 208A–C and a capacitor 210. The inverters of this embodiment are of a conventional design. In one embodiment, the first inverter 208A of the first series includes pmos's having a width of 10 U and a length of 8 U and nmos's having a width of 5 U and a length of 8 U. The second inverter 208B and third inverter 208C includes pmos's having a width of 20 U and a length of 0.5 U and nmos's having a width of 10 U and a length of 0.5 U. In this embodiment the capacitor 210 has a capacitance of 0.28 picofarads. The pulse generator 112 of one embodiment of the present invention also includes a second series of inverters 212A–C. Each of these inverters 212A–C include pmos's having a width of 20 U and a length of 0.5 U and nmos's having a width of 10 U and a length of 0.5 U. The charge capacitor 104 of one embodiment has a capacitance of 9.73 picofarads. In this embodiment a tunneling gate oxide is used to make the charge capacitor 104 because the capacitance of such a realization is independent of the voltage across the capacitor, a property which is necessary for the oscillator frequency to be substantially supply-independent. The discharge switch 114 is an nmos 214 having a width of 20 U and a length of 0.5 U.

The operation of the on-chip oscillator system and method of FIG. 2 is now set forth. A voltage signal output from the matched resistor module 102 charges the charge capacitor 104 which causes the ramp voltage $V_{RAMP}$ to increase when transistor 214 is not conducting. The inverter 202A in the comparator 108 changes state when the $V_{RAMP}$ signal exceeds the threshold voltage of the inverter, e.g., $V_{DD}/2$ to generate an output signal indicating when $V_{RAMP}$ equals or exceeds $V_{DD}/2$. The present invention uses a predetermined percentage of the supply voltage $V_{DD}$ (not a set voltage difference from the supply voltage) in order to reduce the effect of voltage supply variations on the on-chip oscillator 100. As the supply voltage level drops the charge capacitor 104 charges more slowly. If not compensated for, it will take longer to charge the charge capacitor 104 to the comparison voltage. However, since the comparison voltage of present invention is a percentage of the supply voltage, e.g., $V_{DD}/2$, if the supply voltage drops, the comparison voltage also drops proportionally. Therefore, the time required to charge the charge capacitor 104 to the comparison voltage remains substantially constant. As a result the on-chip oscillator of the present invention is substantially independent of voltage variations. It will be apparent that alternate comparison designs are possible without departing from the scope of the present invention.

The output of the comparator 108 is received as one input to a NOR gate 204. A second input to the NOR gate 204 is a disable signal that permits the on-chip oscillator to be disabled by sending a "low" signal on the disable line. The output of NOR gate 204 is received by the latch 110. The latch is a conventional SR flip-flop. The latch output is received by the two series of inverters 208A–C and 212A–C. The first series of inverters 208A–C buffers the latch output and the capacitor 210 slightly delays the signal which is feed back into the NOR gate 206B in the latch 110 to enable the latch to remain in the set state for a long enough duration to permit the discharging of the charge capacitor 104.

The second series of inverters 212A–C buffers the pulse generator output and generates the irc_clk signal that is the output of the on-chip oscillator 100. The signal between inverters 212A and 212B is received at the gate of transistor 214. When $V_{RAMP}$ reaches $V_{DD}/2$, the comparator 108 generates an output signal (a low signal in FIG. 2), NOR gate 204 generates a low signal which is received at the SET input of latch 110. The latch generates a low signal at node 111. This low signal is received by the first series of inverters 208A–C and capacitor 210.

As described above, the first series of inverters delays and inverts the signal and sends the signal to NOR gate 206B. The low signal at node 111 is also received by the second series of inverters 212A–C. Inverter 212A inverts the signal to a high level signal which is coupled to the gate of transistor 214 causing transistor 214 to conduct. When transistor 214 conducts the charge capacitor 104 is coupled to ground and discharges. Simultaneously, the signal output from inverter 212A is sent through inverters 212B and 212C which perform a buffering function and generate the clock pulse signal irc_clk.

As described above, the oscillating frequency of conventional oscillators is dependent upon temperature variations and voltage variations. The present invention alleviates substantially all dependencies based upon such variations. The substantial independence of the present invention with regard to voltage variations is described above. The present invention's ability to be substantially independent of temperature variations is now set forth. A major reason for temperature sensitivity in oscillators is impedance variations of resistors caused by temperature fluctuations. The impedance (resistance) value affects the charge rate of the charge capacitor. Accordingly, variations in the impedance of the resistors in the matched resistor pairs will result in differing oscillator frequencies at different temperatures.

Figure 3:
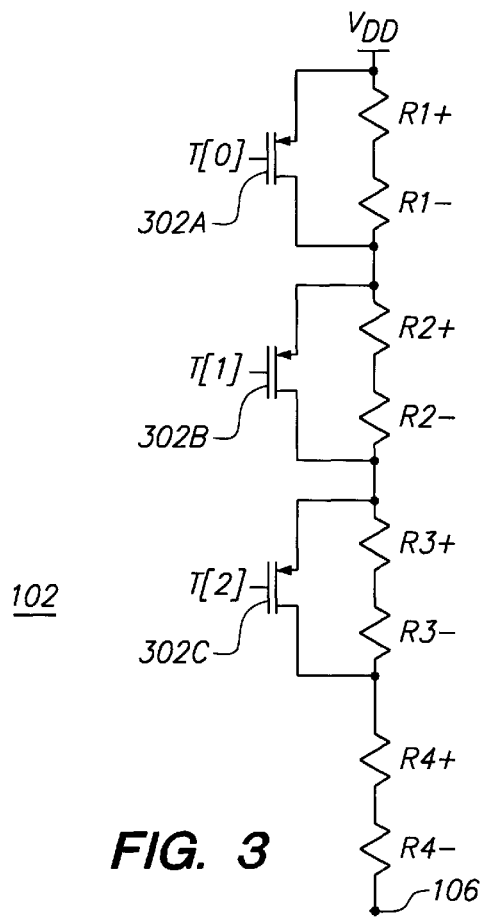
FIG. 3 is a more detailed illustration of the matched resistor pairs according to one embodiment of the present invention.

FIG. 3 is a more detailed illustration of the matched resistor pairs 102 according to one embodiment of the present invention. The matched resistor pairs 102 on this embodiment include four pairs of resistors R1+ and R1−, R2+ and R2−, R3+ and R3−, and R4+ and R4−. Each resistor pair includes a positive and a negative tempco resistor. A positive temperature coefficient (tempco) resistor is a resistor with a positive temperature coefficient. A negative tempco resistor is a resistor with a negative temperature coefficient. In one embodiment, positive tempco resistors are diffused resistors. The resistance of positive tempco resistors rises as the temperature increases. Conversely, the resistance of negative tempco resistors decreases as the temperature increases.

In one embodiment, the positive tempco resistors are diffused resistors having a relatively well controlled and well defined temperature coefficient. The positive tempco resistors are richly-doped diffused resistors. One technique for creating such resistors is to realize them as polygons on the source/drain layer of a CMOS process.

In one embodiment, the negative tempco resistors are low-resistivity CMOS gate polysilicon resistors having a relatively well controlled and well defined temperature coefficient.

The resistors are matched such that an increase in the impedance of one resistor, e.g., R1+, due to a temperature variation will be offset, i.e., nearly canceled, by a corresponding decrease in the impedance of its matched resistor, e.g., R1-. This matching of resistors maintains a near constant impedance which substantially eliminates oscillator frequency variations due to temperature changes. In some embodiments the resistors are laid out so that they are isothermal in order to ensure optimal impedance differential cancellation due to temperature variations over a range of temperatures.

The present invention also includes three nmos devices 302A–C. Each nmos device 302A–C has a programmable signal bit T[0:3] at its gate. It the programmable signal bit is high, the associated nmos 302 conducts and creates a low impedance path across the associated resistor pair. For example if T[0] is high nmos 302A conducts and resistors R1+ and R1– are shorted thereby effecting the overall resistance of the matched resistor module 102. These programmable bits can be used to perform post-packaging trimming to more accurately control the statistical distribution of on-chip oscillators. For example, frequently, the production process introduces minor variations in the impedance values of the resistors in the matched resistor module 102 between production lots. In order to account for such production-introduced variations, the present invention enables the matched resistor module 102 to be modified after the microcontroller, for example, has been packaged. The present invention only removes pairs of resistors in order to preserve the substantial temperature variation independence described above.

FIG. 4 is a timing diagram illustrating an approximation of the oscillator voltage signal and the on-chip oscillator pulse signal according to an example of one embodiment of the present invention. At time $T_1$ $V_{RAMP}$ begins increasing. At time $T_2$, $V_{RAMP}$ reaches the value $V_{DD}/2$, which in this example is the predefined percentage of $V_{DD}$ used by the comparator 108. At time $T_2$, the irc_clk signal pulses high while the $V_{RAMP}$ signal discharges due to nmos 214 conducting. At time $T_3$, the charge capacitor 104 is discharged and $V_{RAMP}$ begins to increase while irc_clk returns to a low state. At time $T_4$ the process repeats.

While the invention has been particularly shown and described with reference to a preferred embodiment and several alternate embodiments, it will be understood by persons skilled in the relevant art that various changes in form and details can be made therein without departing from the spirit and scope of the invention.

What is claimed is:

1. An oscillator comprising:
   a first set of resistors having a substantially constant impedance over a first range of temperatures; including
      a first resistor having a first temperature coefficient such that the impedance of the first resistor increases as temperature increases; and
      a second resistor, coupled in series with said first resistor, having a second temperature coefficient such that the impedance of said second resistor decreases as temperature increases;
      wherein a first impedance change in said first resistor is substantially offset by a second impedance change in said second resistor;
   a capacitor disposed to receive signals from said first set of resistors for charging at a rate that is dependent upon the impedance of said first set of resistors for generating a first periodic signal; and
   a pulse generation system, disposed to receive signals from said capacitor, for generating a second periodic signal having a frequency that is substantially independent of temperature variations.

2. The oscillator of claim 1, wherein said pulse generation means receives a supply voltage and includes:
   a comparator, disposed to receive signals from said capacitor, for comparing said first periodic signal with a predetermined percentage of the supply voltage and for generating a comparator output signal having a frequency that is substantially independent to variations in the supply voltage.

3. The oscillator of claim 2, wherein said pulse generation means further includes:
   a memory device, disposed to receive signals from said comparator, for storing a signal representing said comparator output signal; and
   a pulse generation module, disposed to receive signals from said memory device, for generating said second period signal.

4. The oscillator of claim 3, further comprising:
   a first switch, disposed to receive signals from said capacitor, for creating a low impedance path between said capacitor and a low potential node in response to said comparator, causing said capacitor to discharge after said first periodic signal voltage exceeds said predetermined percentage of said supply voltage.

5. The oscillator of claim 4 wherein said oscillator is embedded in one of a microcontroller and a microprocessor.

6. The oscillator of claim 1, further comprising:
   a programmable switch, coupled to said first set of resistors and disposed to receive a first programmable signal, for forming a low impedance path in parallel with said first set of resistors when said first programmable signal has a first value.

7. The oscillator of claim 1, further comprising:
   a second set of resistors having a substantially constant impedance over a first range of temperatures; including
      a third resistor having a third temperature coefficient such that the impedance of the third resistor increases as temperature increases; and
      a fourth resistor, coupled in series with said third resistor, having a third temperature coefficient such that the impedance of said third resistor decreases as temperature increases;
      wherein a third impedance change in said third resistor is substantially offset by a fourth impedance change in said fourth resistor.

8. The oscillator of claim 7, further comprising:
   a second programmable switch, coupled to said second set of resistors and disposed to receive a second programmable signal, for forming a low impedance path in parallel with said second set of resistors when said first programmable signal has a second value.

* * * * *